United States Patent
Pryor et al.

(10) Patent No.: US 7,960,715 B2
(45) Date of Patent: Jun. 14, 2011

(54) SEMICONDUCTOR HETEROSTRUCTURE NANOWIRE DEVICES

(75) Inventors: Craig Pryor, Iowa City, IA (US); Mats-Erik Pistol, Lund (SE)

(73) Assignee: University of Iowa Research Foundation, Iowa City, IA (US)

( * ) Notice: Subject to any disclaimer, the term of this patent is extended or adjusted under 35 U.S.C. 154(b) by 93 days.

(21) Appl. No.: 12/428,410

(22) Filed: Apr. 22, 2009

(65) Prior Publication Data

US 2009/0289244 A1 Nov. 26, 2009

Related U.S. Application Data

(60) Provisional application No. 61/047,677, filed on Apr. 24, 2008.

(51) Int. Cl.
*H01L 31/00* (2006.01)
(52) U.S. Cl. .......................................................... 257/22
(58) Field of Classification Search .................... 257/22, 257/E29.067, E21.09; 977/762, 840
See application file for complete search history.

(56) References Cited

U.S. PATENT DOCUMENTS

| | | | |
|---|---|---|---|
| 5,281,543 A | 1/1994 | Fukuzawa et al. | |
| 5,614,435 A | 3/1997 | Petroff et al. | |
| 5,714,765 A | 2/1998 | Noetzel | |
| 6,218,272 B1 | 4/2001 | Yeom et al. | |
| 6,855,202 B2 | 2/2005 | Alivisatos | |
| 6,882,051 B2 | 4/2005 | Majumdar | |
| 7,125,786 B2 | 10/2006 | Ring et al. | |
| 7,254,151 B2 | 8/2007 | Lieber et al. | |
| 7,302,856 B2 | 12/2007 | Tang | |
| 7,330,369 B2 | 2/2008 | Tran | |
| 7,335,908 B2 | 2/2008 | Samuelson et al. | |
| 7,354,850 B2 | 4/2008 | Seifert et al. | |
| 2004/0075464 A1 | 4/2004 | Samuelson et al. | |
| 2005/0161662 A1 | 7/2005 | Majumdar | |
| 2005/0218398 A1 | 10/2005 | Tran | |
| 2006/0125056 A1 | 6/2006 | Samuelson et al. | |
| 2007/0012354 A1 | 1/2007 | Kobayashi et al. | |
| 2007/0157873 A1 | 7/2007 | Hauptmann | |
| 2007/0164270 A1 | 7/2007 | Majumdar | |
| 2007/0267626 A1 | 11/2007 | Indlekofer | |
| 2007/0281156 A1 | 12/2007 | Lieber et al. | |
| 2008/0032134 A1 | 2/2008 | Whiteford | |

FOREIGN PATENT DOCUMENTS

| | | |
|---|---|---|
| DE | 102006024610 A1 | 11/2007 |
| EP | 0535293 A1 | 1/1992 |
| WO | WO2004/004927 A2 | 1/2004 |
| WO | WO2004/038767 A2 | 5/2004 |
| WO | WO2005/093831 A1 | 10/2005 |
| WO | WO2006/132659 A2 | 12/2006 |
| WO | WO2007/038164 A2 | 4/2007 |

(Continued)

OTHER PUBLICATIONS

Zanolli et al., "Fabrication, optical characterization and modeling of strained core-shell nanowires", Thin Solid Films, vol. 515, No. 2, pp. 793-796 (2006).

(Continued)

*Primary Examiner* — Thanh V Pham
*Assistant Examiner* — Mark A Laurenzi, III
(74) *Attorney, Agent, or Firm* — Foley & Lardner LLP

(57) ABSTRACT

Nanowire devices comprising core-shell or segmented nanowires are provided. In these nanowire devices, strain can be used as a tool to form metallic portions in nanowires made from compound semiconductor materials, and/or to create nanowires in which embedded quantum dots experience negative hydrostatic pressure or high positive hydrostatic pressure, whereby a phase transitions may occur, and/or to create exciton crystals.

16 Claims, 10 Drawing Sheets

FOREIGN PATENT DOCUMENTS

| | | |
|---|---|---|
| WO | WO2007/044034 A2 | 4/2007 |
| WO | WO2007/136841 A2 | 11/2007 |
| WO | WO2008/013959 A2 | 1/2008 |
| WO | WO2008/0032134 A1 | 2/2008 |
| WO | WO2008/034823 A1 | 3/2008 |

OTHER PUBLICATIONS

Zhang et al., "Strain Induced Photoluminescence From Silicon and Germanium Nanowire Arrays", APS.

Audoit et al., "Instrinsic current-voltage properties of nanowires with four-probe scanning tunneling microscopy: A conductance transition of ZnO nanowire", Appl. Phys. Lets., vol. 89, p. 043103 (2006).

Duan et al., "Strain Induced Half-Metal to Semiconductor Transition in GdN", Phys. Rev. Lett., vol. 94, pp. 237201 (2005).

Kaminskii et al., "Transport properties of bismuth nano-wire systems", Tech. Phys., vol. 43, No. 3, pp. 314-317 (1998).

Lin et al., "Thermoelectric properties of superlattice nanowires", Phys. Rev. B, vol. 68, p. 075304 (2003).

Wu et al., Single-Nature, vol. 430, pp. 61-65 (2004).

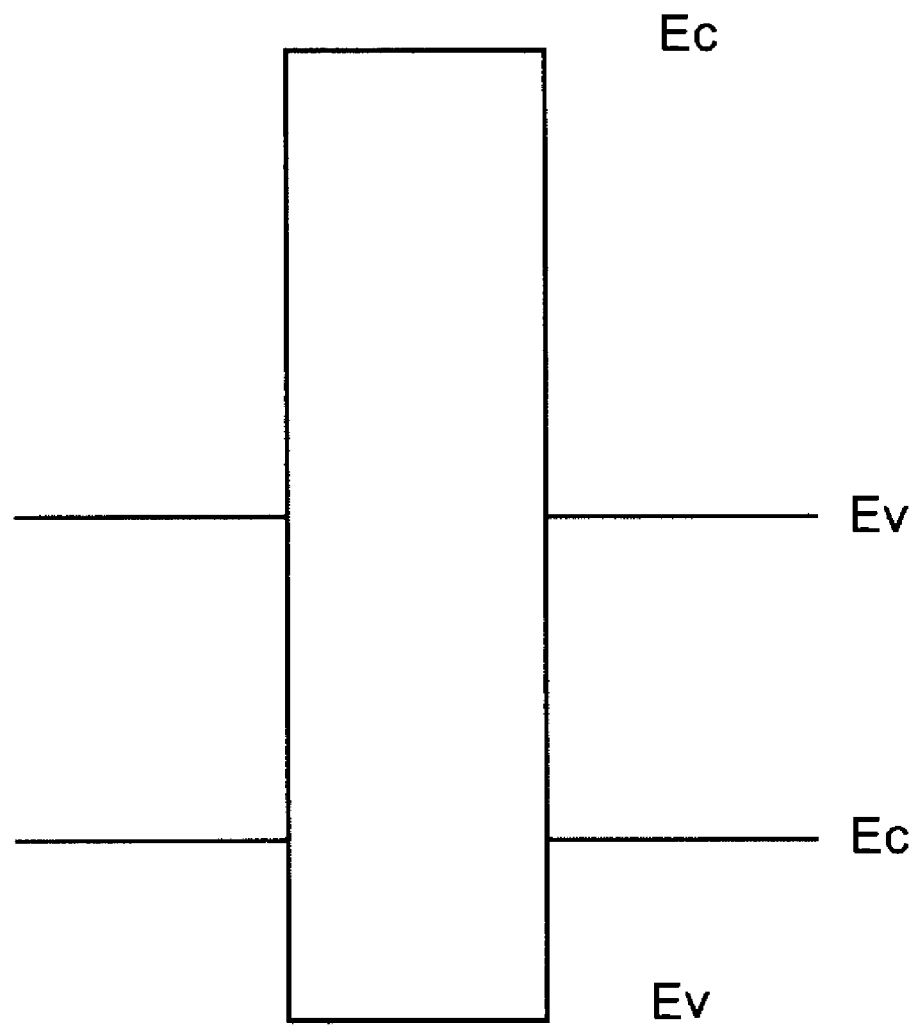
FIG. 5

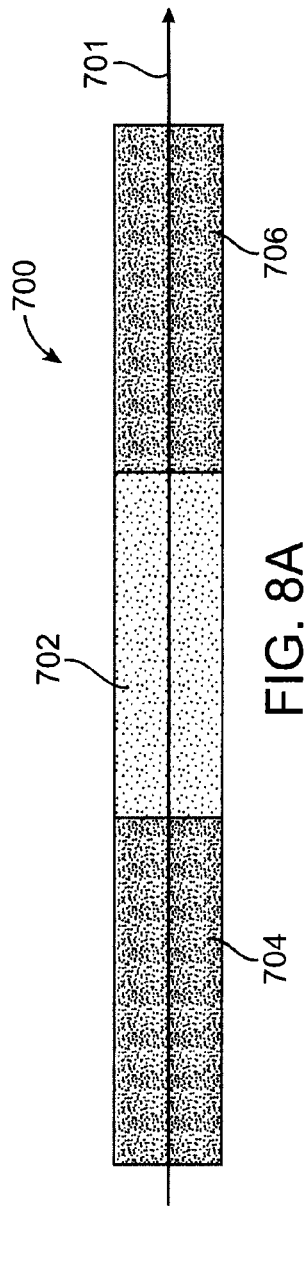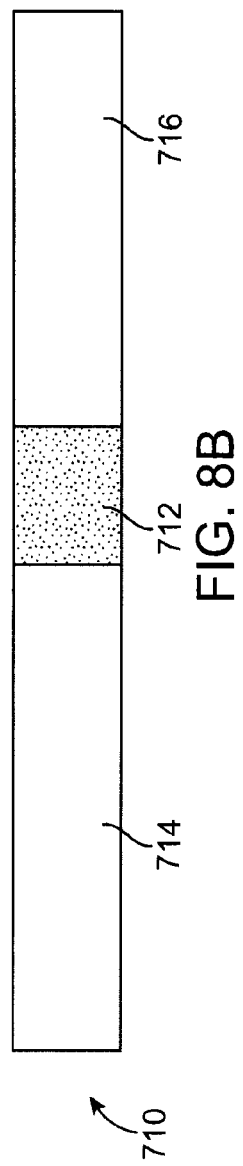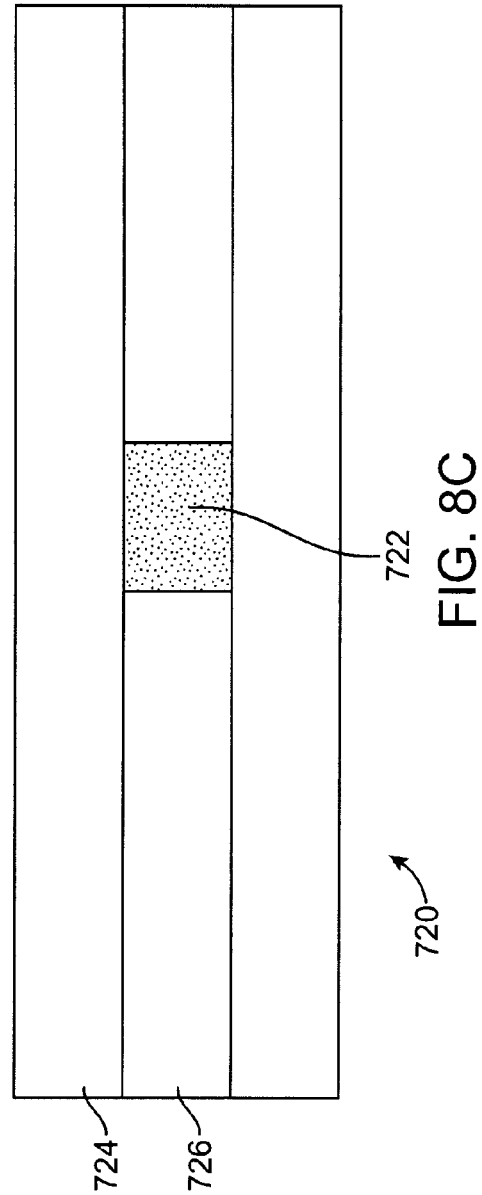

SEMICONDUCTOR HETEROSTRUCTURE NANOWIRE DEVICES

CROSS-REFERENCE TO RELATED APPLICATIONS

This application claims priority of U.S. provisional application Ser. No. 61/047,677, filed Apr. 24, 2008, the disclosure of which is incorporated by reference in its entirety.

BACKGROUND

There is presently a global effort to understand one-dimensional systems such as semiconductor quantum wires and carbon nanotubes. Such one-dimensional systems find a wide variety of applications in, for example, integrated circuits, and chemical and biological sensors. The electronics industry is currently developing semiconductor nanowire-based devices to possibly replace or complement complementary metal-oxide-semiconductor (CMOS) technologies. The nano-scale wires have a large surface area, and thus can be advantageously applied to sensing, e.g., of biological and other molecules.

While semiconductor wire-based devices and systems are being developed, it has been difficult to make electrical contacts to them thus hindering their uses. Conventional contacts for nanowires involve evaporating metal directly onto the wires, a process very difficult to control and potentially damaging to the wires. Often the resulting contacts are not low-resistance and the resistance of the contact varies from sample to sample.

SUMMARY

Nanowire devices made from core-shell and segmented nanowires are provided. In these nanowire devices, strain is used as a tool to form metallic portions in nanowires made from semiconductor materials, and/or to create nanowires in which embedded quantum dots experience negative hydrostatic pressure or high positive hydrostatic pressure, whereby a phase transition may occur, and/or to create exciton crystals.

In one aspect, a heterostructure semiconductor nanowire device is provided, the device including a first portion comprising a first compound semiconductor material, and a second portion comprising a second compound semiconductor material, wherein the first compound semiconductor material and the second compound semiconductor material are selected such that at least one of the first portion and the second portion is substantially metallic as a result of a strain between the first compound semiconductor material and the second compound semiconductor material. The contact formed by the first and second compound semiconductor materials can be an Ohmic contact or a Schottky contact, depending upon the particular materials employed.

In one embodiment the nanowires are core-shell nanowires, wherein the first portion comprises a core portion, and the second portion comprises a shell portion epitaxially grown on, and substantially surrounding, the core portion. If the shell portion is metallic and the core portion is not, the structure provides a semiconductor nanowire with a reliable and reproducible electrical contact. The shell portion may surround substantially the entire core portion or only one or more parts of the core portion. For example the core portion may comprise a semiconducting nanowire with a metallic shell portion substantially surrounding one or both ends.

The first material and the second material may be selected such that a band structure in a transverse direction of the device has a type III configuration where a bandgap of the core portion does not overlap with a bandgap of the shell portion, and wherein a Fermi level is located between the bandgap of the core portion and the bandgap of the shell portion. The first material and the second material in this embodiment can be independently selected from various combinations of compound semiconductors, including III-V semiconductors, or from various combinations of compound semiconductors with non-compound semiconductors. Specific examples include GaSb, GaP, InP, InAs, GaAs, GaSb, AlSb, and InSb. For example, suitable first material/second material pairs (or second material/first material pairs) include GaSb/InAs, InSb/InAs, InSb/InP, InSb/GaAs, and InSb/GaP.

Alternatively, the first material and the second material may be selected such that at least one of the core portion and the shell portion has a strain-induced negative bandgap where a conduction band minimum is below a valence band maximum. The first material and the second material in this embodiment can be independently selected from various combinations of compound semiconductors, including III-V semiconductors, or from various combinations of compound semiconductors with non-compound semiconductors. Specific examples include InP, GaP, InAs, AlP, AlAs, GaAs, GaSb, AlSb, and InSb. For example, suitable first material/second material pairs (or second material/first material pairs) include AlP/InSb, GaP/InSb, AlAs/InSb, GaAs/InSb, InAs/InSb, Si/InSb and Ge/InSb.

In another embodiment the nanowires are segmented nanowires having a plurality of alternating first portions (i.e., first segments) and second portions (i.e., second segments) disposed along the length of the nanowire. In this embodiment, the first segments and the second segments are disposed at different axial locations along the nanowire. The first and second segments can be made from a first compound semiconductor material and a second compound semiconductor material, respectively. The first and second semiconductor materials desirably have different lattice constants such that a nanowire having alternating semiconducting and strain-induced metallic segments along it length may be produced. The materials are desirably, but not necessarily, selected such that the second segment is in a state of tension, rather than compression. The device may further include a shell structure comprising a capping material substantially surrounding the first and second segments, whereby the second segments form a plurality of quantum dots embedded in the nanowire. In one variation of this embodiment, the first, second, and capping materials are selected such that the strain in the structure is sufficient to provide embedded quantum dot having a negative hydrostatic pressure. The first compound semiconductor material and the capping material may be the same or different.

Characteristics of the core-shell and segmented nanowires that may be selected and tailored to provide desirable properties include, but are not limited to, the composition of the core and shell or the segments, the radius of the core, the diameter of the shell, the number of embedded quantum dots along the wire, the size of the quantum dots, the distance between the quantum dots, and the hydrostatic pressure of the quantum dots. By way of illustration only, the nanowires typically have diameters of no greater than about 500 nm. This includes nanowires having diameters of no greater than about 100 nm, no greater than about 75 nm, and no greater than about 50 nm. For example, the nanowires can have a diameter of about 10 nm to about 100 nm. In the case of the segmented nanowires, the segments may have dimensions of, for example, up to about 200 nm, up to about 100 nm, up to about 50 nm or up to about 20 nm. For example, the segments may have lengths of about 10 nm to about 100 nm. The distance between the quantum-dot-forming segments in the segmented nanowires can vary widely since the nanowires can be very long. For example, the quantum dots within the nanowires can be separated by distances of about 2 nm up to distances of several micrometers (e.g., ≧3 micrometers). However, nanowires having dimensions outside these ranges are also contemplated. In some embodiments, one or more of these parameters is tailored to provide single photons on demand.

In the case of core-shell nanowires, the total fraction of the diameter made up by the shell may vary widely. For example, in some embodiments the shell can account for about 10% to about 90% of the diameter. This includes embodiments where the shell accounts for about 40% to about 60% of the total nanowire diameter.

The core diameter can be tailored to provide a desired bandgap configuration, depending on the particular semiconductor materials employed. By way of illustration only, devices with a type III configuration can be obtained in GaSb/InAs and InSb/InAs nanowires for all core and shell diameters. For InSb/GaP nanowires core diameters that are less than about 90% of the total diameter may be desirable for producing a type III configuration. For InSb/GaAs nanowires core diameters that are less than about 60% of the total diameter may be desirable for producing a type III configuration. For InSb/InP nanowires core diameters that are less than about 75% of the total diameter may be desirable for producing a type III configuration. However, for each of these compound semiconductor combinations, core diameters outside these ranges are also contemplated.

The ratio of core to shell in the core-shell nanowires can also be tailored to provide a negative bandgap. By way of illustration only, devices with a strain-induced negative bandgap can be obtained in AlP/InSb nanowires with core diameters greater than about 40% of the total diameter. For GaP/InSb nanowires core diameters greater than 40% of the total diameter may be desirable for producing a negative bandgap. For AlAs/InSb nanowires core diameters greater than 50% of the total diameter may be desirable for producing a negative bandgap. For GaAs/InSb nanowires core diameters greater than 50% of the total diameter may be desirable for producing a negative bandgap. For InAs/InSb nanowires core diameters greater than 60% of the total diameter may be desirable for producing a negative bandgap. However, for each of these compound semiconductor combinations, core diameters outside these ranges are also contemplated.

In another aspect, a nanoelectronics system, including a heterostructure semiconductor nanowire device as described herein, is provided. In this system, the metallic portion of the nanowire device provides a contact to which an external circuit or electronic device may be coupled. If the nanowire of the nanowire device is a core-shell type nanowire, the contact comprises at least one of the core portion or the shell portion. If the nanowire of the nanowire device is a segmented nanowire, the contact comprises at least one of the first segment or the second segment.

In another aspect, a method of providing an integral electrical contact to an electronic device is provided, the method including coupling the electronics device with the metallic portion of a heterostructure semiconductor nanowire device as described herein. Suitable electronic devices that may be coupled to the present nanowire devices include, but are not limited to, integrated circuits, biological and chemical sensors, light emitting diodes, photovoltaic cells, or a combination thereof. The method can also include electrically coupling the contact with an external circuit.

Further objects, features, and advantages of the embodiments will be apparent from the following detailed description when taken in conjunction with the accompanying drawings.

BRIEF DESCRIPTION OF THE DRAWINGS

FIG. 5 is a diagram illustrating an inversed band structure in the shell of a core-shell nanowire;

FIG. 8A is a schematic diagram illustrating a segmented nanowire;

FIG. 8B is a schematic diagram illustrating a segmented nanowire with a segment in tension;

FIG. 8C is a schematic diagram illustrating a capped nanowire with an embedded quantum dot having a negative hydrostatic pressure;

DETAILED DESCRIPTION

Figure 1C:
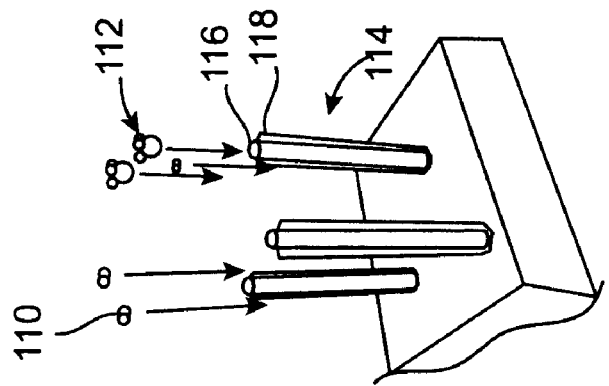
FIGS. 1A-1C are schematic diagrams illustrating a method of growing nanowires.

All references are incorporated by reference in their entirety.

The embodiments may be understood more readily by reference to the following detailed description, examples, drawings, and claims, and their previous and following description. However, before the present devices, systems, and/or methods are disclosed and described, it is to be understood that the embodiments are not limited to the specific devices, systems, and/or methods disclosed unless otherwise specified, as such can, of course, vary. It is also to be understood that the terminology used herein is for the purpose of describing particular aspects only and is not intended to be limiting.

As used in the specification and the appended claims, the singular forms "a," "an" and "the" include plural referents unless the context clearly dictates otherwise.

Ranges may be expressed herein as from "about" one particular value, and/or to "about" another particular value. When such a range is expressed, another embodiment includes from the one particular value and/or to the other particular value. Similarly, when values are expressed as approximations, by use of the antecedent "about," it will be understood that the particular value forms another embodiment. It will be further understood that the endpoints of each of the ranges are significant both in relation to the other endpoint, and independently of the other endpoint.

As used herein, the terms "optional" or "optionally" mean that the subsequently described event or circumstance may or may not occur, and that the description includes instances where said event or circumstance occurs and instances where it does not.

Reference will now be made in detail to the present preferred aspects of the embodiments, examples of which are illustrated in the accompanying drawings. Wherever possible, the same reference numbers are used throughout the drawings to refer to the same or like parts.

Nanowire devices comprising core-shell and/or segmented nanowires are provided. In these nanowire devices, strain is used as a tool to form metallic portions in nanowires made from semiconductor materials, to create nanowires in which embedded quantum dots experience negative hydrostatic pressure or high positive hydrostatic pressure, whereby a phase transitions occurs, and/or to create exciton crystals.

In one aspect, semiconductor nanowires having integrally formed metallic electrical contacts for easy electrical coupling to electronics devices are provided. The electrical contacts are metallic portions of the nanowires created through band-structure-engineered heterostructures. The resulting contacts can be generally more reproducible and reliable than conventional contacts formed by the deposition of metals on semiconducting nanowires. The contacts can be engineered to be either Ohmic or Schottky by selecting a suitable semiconductor materials.

In one basic embodiment the nanowires include a first portion comprising a first compound semiconductor material and a second portion comprising a second compound semiconductor material and epitaxially grown on the first portion. The first compound semiconductor material and the second compound semiconductor material have different lattice constants when existing as bulk materials, which results in a strain in either the first semiconductor material or the second semiconductor material when the first and second compound semiconductor materials are assembled in a nanowire. This difference in lattice constants produces a strain in either the first semiconductor material or the second semiconductor material. As a result of this strain, at least one of the first and second semiconductor materials is substantially metallic. The first and second portions may take the form of a core and a shell to provide core-shell nanowire or may take the form of semiconductor segments spaced laterally along the length of the nanowire.

The nanowires comprise various combinations of compound semiconductor material in the core and shell or in the axial segments. In some embodiments, the nanowires comprise a combination of compound semiconductors with non-compound semiconductors. Suitable compound semiconductors include, but are not limited to, group III-V semiconductors, group II-VI semiconductors and nitride-containing semiconductors. Suitable non-compound semiconductors include group IV semiconductors, such as Si and Ge. By way of illustration, semiconductor material combinations that may be used to form the core-shell and segmented nanowires include, but are not limited to, GaSb/InAs, InSb/InAs, GaP/InSb, InP/InSb, InAs/GaSb, InAs/InSb, InSb/GaP, InSb/InP, AlP/InSb, AlAs/InSb, GaAs/InSb, Si/InSb, Ge/InSb, InSb/AlP, InSb/AlAs, InSb/GaAs, InSb/InAs, InSb/Si, and InSb/Ge.

Core-Shell Nanowires:

Selected combinations of compound semiconductor materials can be used to produce the heterostructure core-shell nanowires, wherein at least one of the core or the shell becomes metallic as a result of a strain-induced semiconductor-metal phase transition and/or the natural band edge line up of the selected materials. The metallic semiconductor portion of the nanowire (whether core or shell) can be used as a contact to electrically couple the nanowire device to an external circuit. The core-shell nanowires may comprise a variety of compound semiconductor materials including, but not limited to, III-V compound semiconductors such as AlP, AlAs, AlSb, GaP, GaAs, InP, InAs and InSb. The strain in the nanowires may be confirmed using photoluminescence (PL) emissions that are shifted due to the strain in the heterostructures.

The wires can be formed by many different methods including, but not limited to, metal-organic vapor phase epitaxy and molecular beam epitaxy. In such methods a metal catalyst in the form of a small particle seeds the growth of the nanowire. The diameter of the nanowire can be determined by the size of the metal particle and the length of the nanowire by the growth time. Many precursors can be used for the growth of the nanowires. Typical precursors include organometallic compounds, such as trimethyl gallium, trimethyl indium, arsine, phosphine and the like. These precursors allow for the growth any III-V material as well as silicon and germanium. By changing the growth conditions, for example by increasing the temperature, it is possible to cap the nanowire with a shell to form a core-shell nanowire.

Figure 1B:
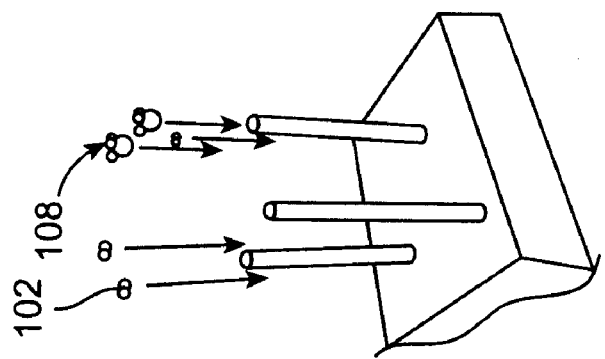
Figure 1A:
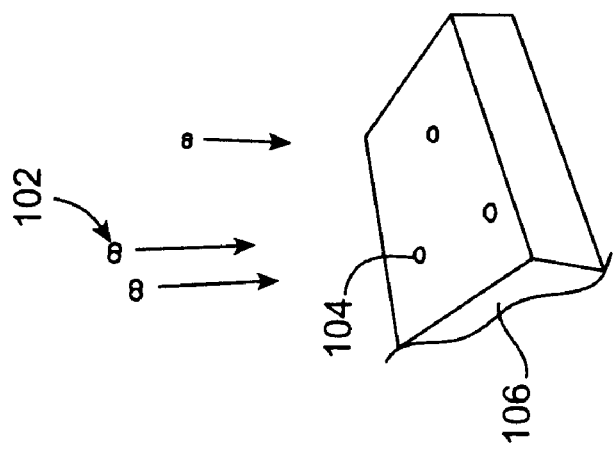

Methods of growing nanowires are generally known in the art. See, e.g., Zanolli et al., *Thin Solid Films*, Vol. 515, No. 2, pp. 793-796 (2006). FIGS. 1A-1C are schematic diagrams illustrating a method adapted from Zanolli et al. for growing core-shell nanowires. As shown in this example, the core-shell nanowires 114 are grown on a substrate 106 (e.g., InAs (111)) seeded with metal catalyst particles 104 (e.g., gold particles). The catalyst particles are exposed to a first precursor gas 102 (e.g., $As_2$) at a first temperature (e.g., 510° C.). A second precursor gas 108 (e.g., trimethyl gallium) can then be introduced into the system at a second temperature (e.g., 420° C.), whereby compound semiconductor nanowire cores 116 (e.g., GaAs cores) can be grown from seed catalyst particles 104. The nanowire cores 116 can then be exposed to one or more third precursor gases 112 (e.g., an Sb-containing organometallic and trimethyl indium—"TM In") at a third temperature (e.g., 350° C.), whereby a shell 118 (e.g., an InSb shell) can be grown over the core. The particular materials and temperatures described above are used by way of illustration only. Although the first, second and third temperature shown in FIGS. 1A-1C decrease chronologically, the temperatures may also increase from step to step.

Figure 2:
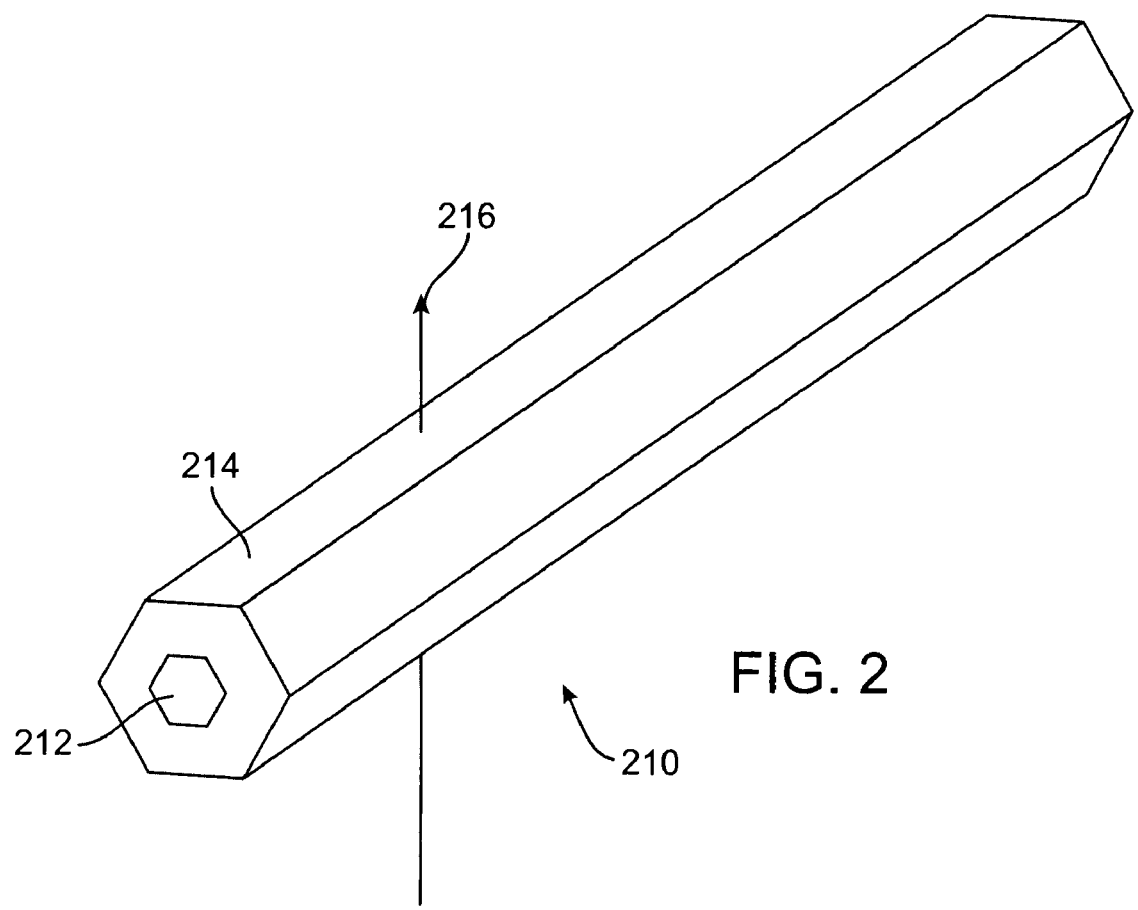
FIG. 2 is a schematic diagram illustrating a perspective view of a core-shell nanowire.

FIG. 2 is a schematic diagram illustrating a perspective view of core-shell nanowire 210. Core-shell nanowire 210 comprises a core portion 212 comprising a first compound semiconductor material, and a shell portion 214 comprising a second compound semiconductor material. In a preferred embodiment, shell portion 214 can be epitaxially grown on core portion 212. As shown, both core portion 212 and shell portion 214 have approximately hexagonal cross sections, and shell portion 214 substantially surrounds core portion 212. However, the nanowires can have other cross-sectional shapes including, but not limited to, a circular or a square cross-sectional shape. Arrow 216 indicates the radial, or transverse direction of wire 210, along which direction the band diagrams in the following FIGS. 3-7 are displayed.

Figure 3:
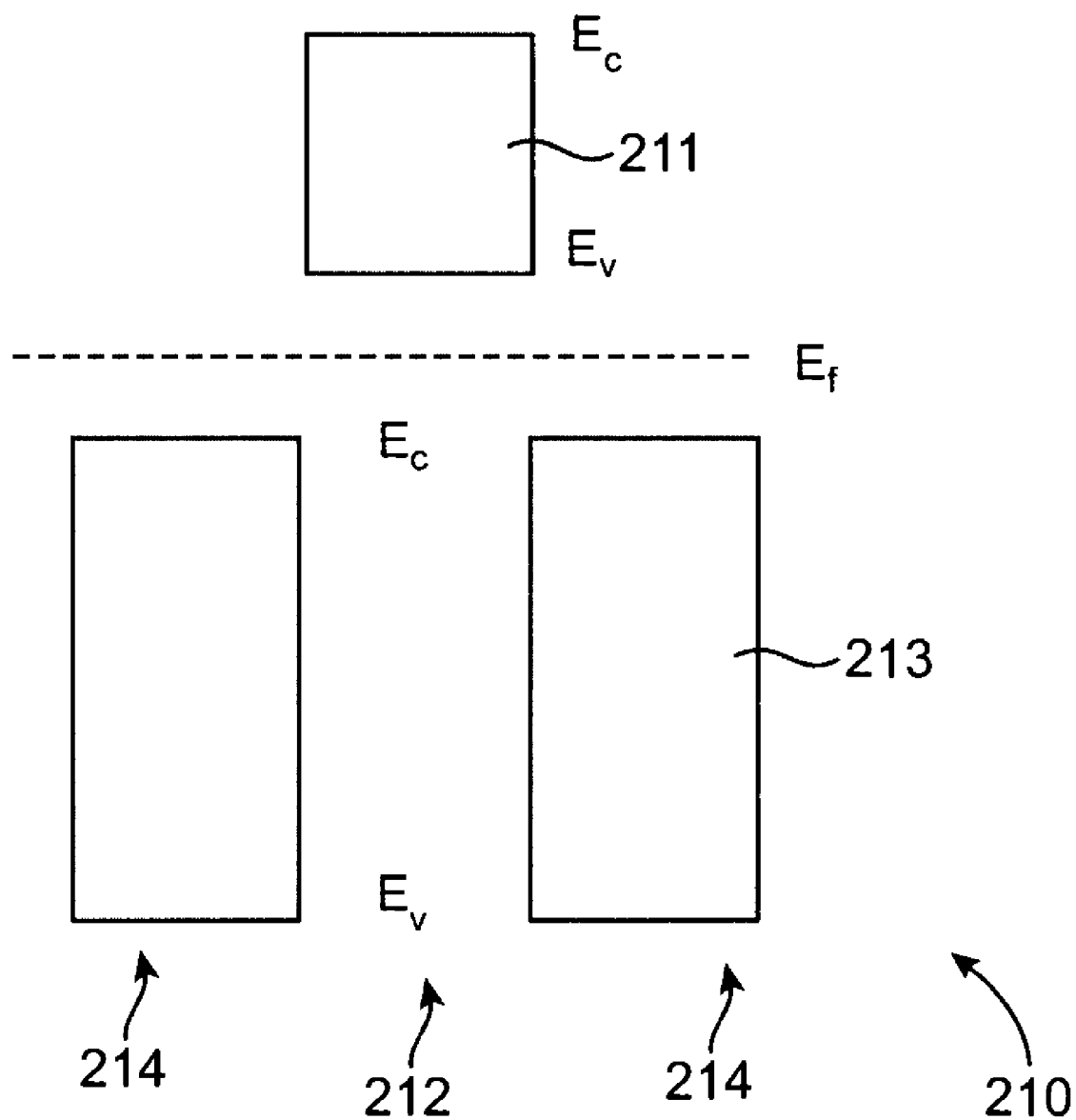
FIG. 3 is a diagram illustrating a type III band lineup configuration of a core-shell nanowire.

In accordance with one variation of the core-shell nanowire embodiment, a "type III" band offset can be engineered into the nanowires by the selection of appropriate materials and/or by appropriate strain engineering. FIG. 3 illustrates a type III band lineup scheme, in which the maximum of the valence band ($E_V$) of core portion 212 is above the Fermi level ($E_f$), and $E_f$ is above the minimum of the conduction band ($E_C$) of shell portion 214. Thus, a bandgap 211 of core portion 212 does not overlap with a bandgap 213 of shell portion 214, and $E_f$ is located between bandgap 211 and bandgap 213. In this structure, electrons will transfer from core portion 212 to shell portion 214, providing electron conductivity in shell portion 214 and hole conductivity in core 212. The resulting shell of nanowire 210 may have metallic conductivity, while the core may remain semiconducting. Unlike conventional semiconductors, the metallicity is achieved through strain in the axial heterostructures, not through doping.

A strain-dependent k•p model can be used to numerically model core-shell structures to identify the material combinations that give metallic conductivity in semiconductor materials. For example, this model identifies GaSb/InAs, InSb/InAs, GaP/InSb, and InP/InSb as core/shell material combinations that can lead to a type-III band-offset.

Figure 4:
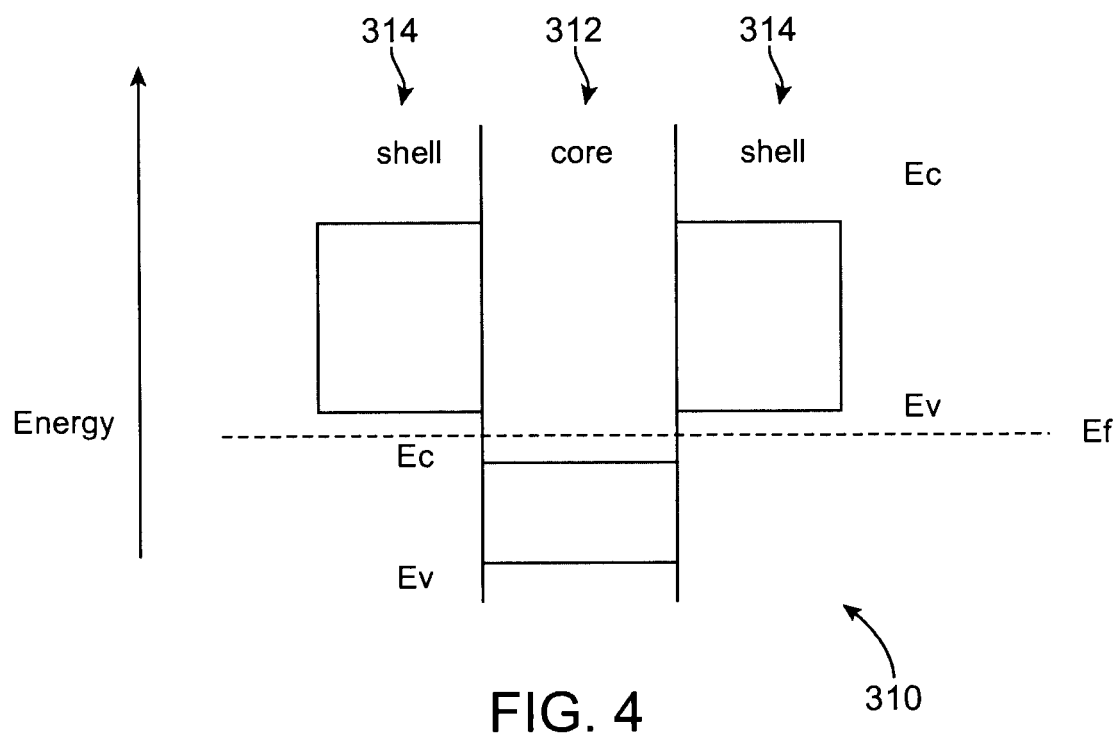
FIG. 4 is a diagram illustrating another type III band lineup configuration of a core-shell nanowire.

It is also possible to select materials such that electrons accumulate in the core portion and holes accumulate in the shell portion. FIG. 4 provides such an example of a core-shell structure 310, where the valence band of shell portion 314 will donate electrons to the conduction band of core portion 312. Core portion 312 can thus become metallic with electron conductivity, and shell portion 314 can become metallic with hole conductivity. An exemplary material combination comprises InAs for core portion 312 and GaSb for shell portion 314.

In another embodiment, metallic conductivity can be realized through a "negative bandgap" in a core-shell structure 410 shown in FIG. 5. As shown, core portion 412 has a normal band gap where the conduction band minimum ($E_C$) is above the valence band maximum ($E_V$), and core portion 412 is thus semiconducting. Shell portion 414 as shown has obtained a negative band-gap due to strains, and the resulting conduction band minimum ($E_C$) is lower than the valence band maximum ($E_V$). Shell portion 414 will thus have a metallic conductivity.

Figure 6:
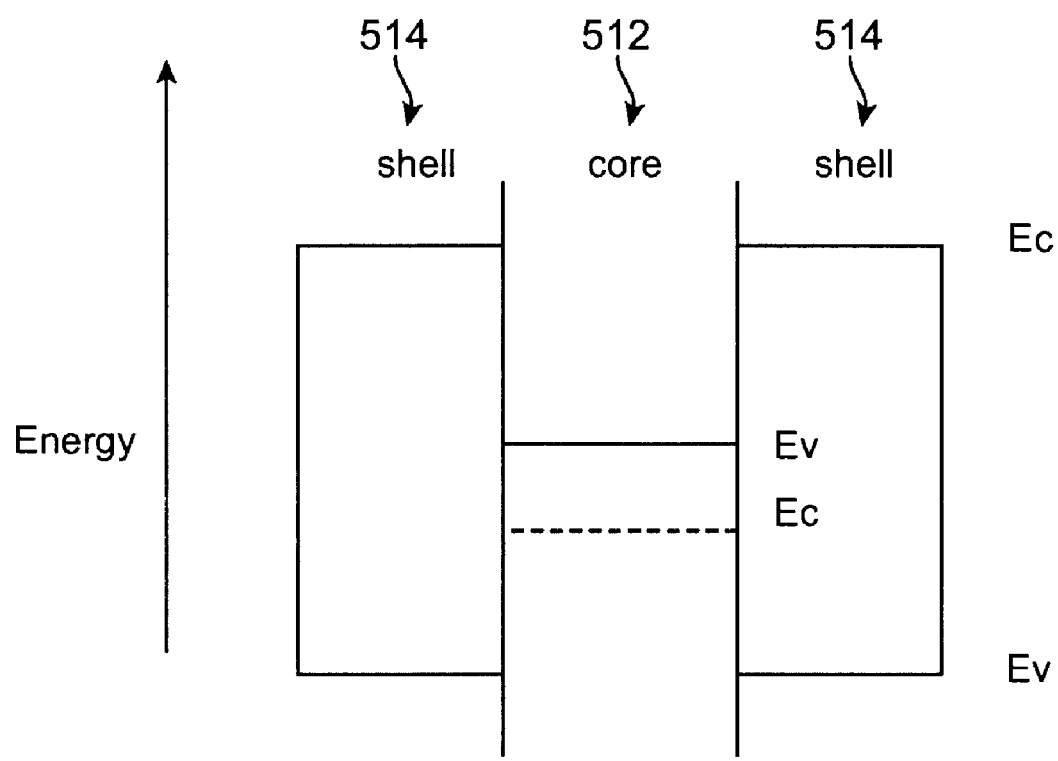
FIG. 6 is a diagram illustrating an inversed band structure in the core of a core-shell nanowire.
Figure 7:
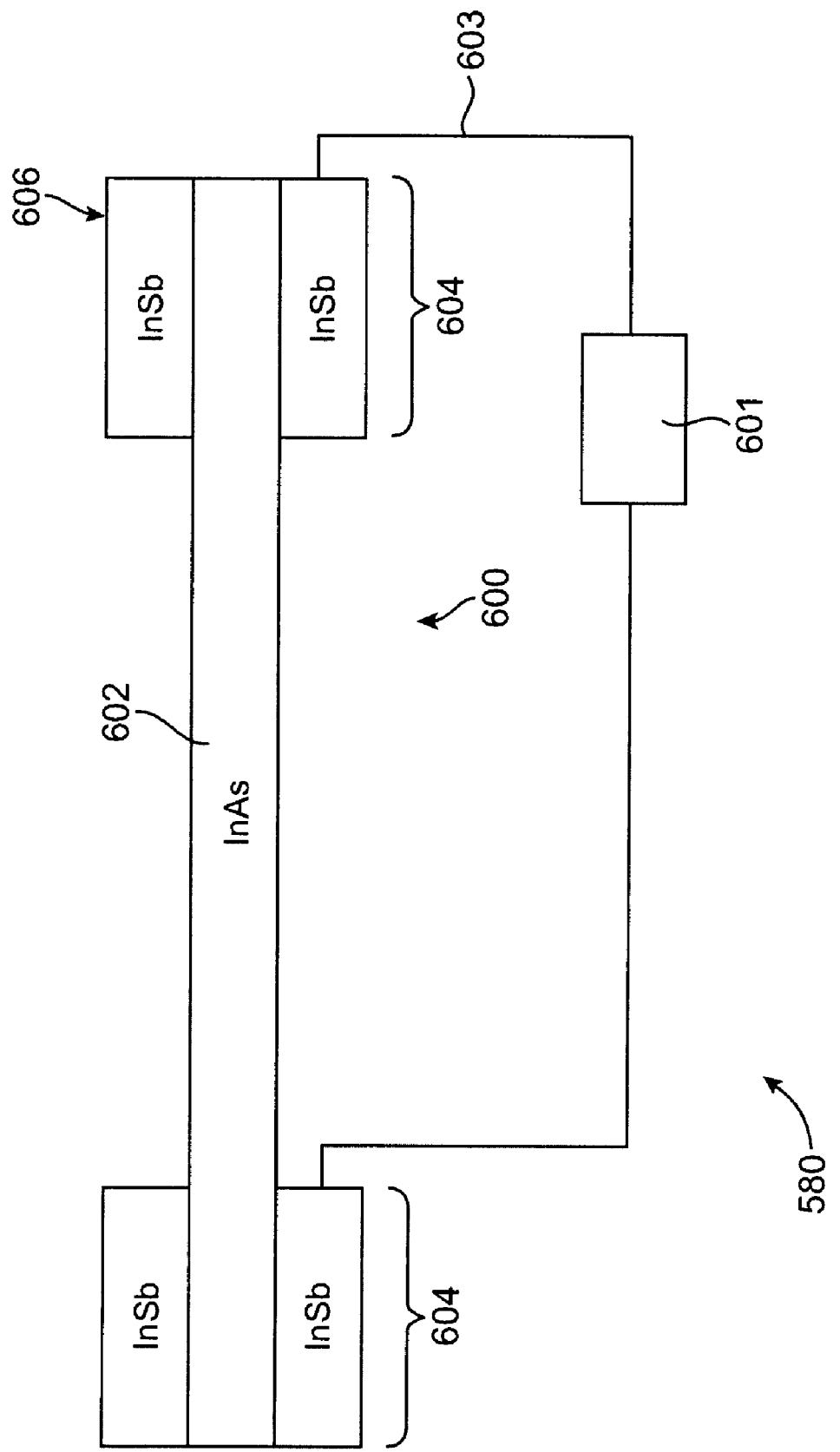
FIG. 7 is a schematic diagram illustrating a nanoelectronics system including a nanowire device having metallic semiconductor contact portions.

By selecting suitable materials, an opposite configuration 510 can be realized as shown in FIG. 6, where the negative band gap is in core portion 512 and the normal, positive band gap is in shell portion 514. Core portion 512 is thus metallic. Shell portion 514 may comprise, for example, InP, and core portion 512 may comprise, for example, InSb. Other core/shell material combinations that can lead to a negative band-gap include, for example, AlP/InSb, GaP/InSb, AlAs/InSb, GaAs/InSb, and InAs/InSb.

Although the "type III" band structures and the negative band-gap structures have been described above with respect to the core-shell embodiments of the nanowires, it should be understood that corresponding band structures can also be implemented in the segmented nanowires which are described in greater detail below. In either case, the "type III" band offsets and negative band-gaps can occur as a result of strain and/or the natural band lineup of the selected combination of compound semiconductor materials. Thus, both strain engineering and the selection of materials can be utilized to engineer the band structures in the design of the core-shell or segmented wire structures.

In accordance with an embodiment, band-structure-engineered heterostructures having metallic portions and semiconducting portions are used to form integral contacts for electronics systems. As shown in an exemplary system 580 in FIG. 7, an InAs/InSb core-shell structure 606 may be used at each end 604 of InAs nanowire device 600 to electrically couple InAs nanowire device 600 with an external electronic circuit 601.

Core portion 602 of nanowire device 600 itself is still semiconducting, and may be used as part of a semiconductor device, such as a PN-junction, a biological or chemical sensor, or a light emitting diode (LED). However, the strained InSb shell 606 results in metallic contacts at the ends of nanowire device 600. From such metallic contacts, conventional metal electrical conduits 603 may be used to electrically couple nanowire device 602 with external circuit 601. Electrical conduits 603 may be coupled to metallic core-shell structure 606, for example, using metal evaporation. Alternatively, external circuit 601 may be directly coupled to nanowire device 600 at the integrally-formed contact portions 604.

Segmented Nanowires:

The above-described core-shell structures include semiconductor heterostructures in a radial or transverse direction 216 (FIG. 2) of the wire. In accordance with other embodiments, the semiconductor composition can also be modulated along an axial or longitudinal direction of a nanowire, thereby forming a segmented nanowire. Thus, segmented nanowires provide another aspect of the present disclosure. These segmented nanowires can be designed to provide alternating semiconducting and metallic segments along the length of the nanowire and/or to provide embedded quantum dot segments under negative or positive hydrostatic pressure.

Segmented Nanowires Having One or More Metallic Segments:

As shown in FIG. 8A the present nanowires may be strain-engineered to provide nanowires having one or more metallic segments. In FIG. 8A, nanowire 700 comprises alternating semiconducting portion 702, and metallic portions 704, 706 along the axial direction 701. A distance d between metallic portions 704, 706 can be selected to provide for a desired degree of coupling between plasmons, which are quantized electron plasma oscillations. The tunneling through semiconducting portion 702 can be utilized in constructing novel electronic devices.

Figure 9:
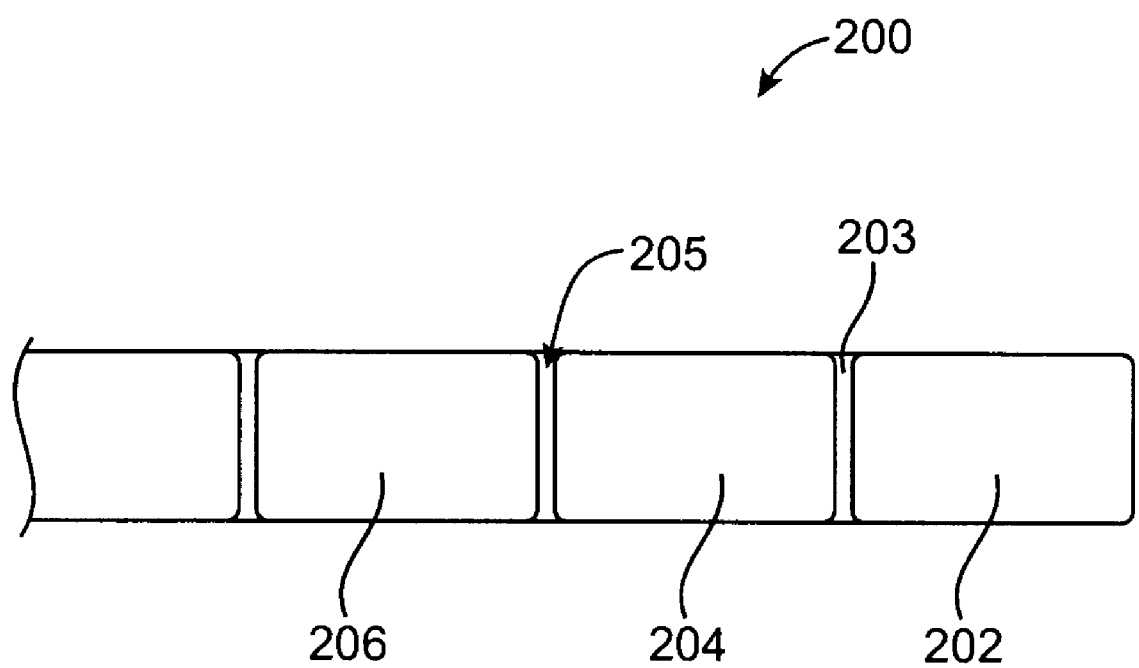
FIG. 9 is a schematic illustration of a segmented nanowire.

FIG. 9 is a schematic illustration of a segmented nanowire. As shown, segmented nanowire 200 comprises a plurality of first segments 202, 204, 206 separated by a plurality of second segments 203, 205. Depending on whether the first and second compound semiconductor materials are lattice matched, second segments 203, 205 may be without strain or may be strained.

In the segmented nanowires, electron and hole effective masses can be tailored along the length of the nanowires through band structure engineering of the heterostructures. Thus, in certain variations of the segmented nanowire embodiment, the segmented nanowires may form metallic superlattices with a periodic longitudinal mass modulation and the resulting electrical and optical effects can be utilized for novel electronic devices.

Segmented Nanowires Having Quantum Dots Under Hydrostatic Pressure:

One of the advantages of the segmented nanowires disclosed herein is the ability to reach higher strains than that can be obtained in two-dimensional systems. For example, quantum wells can only be grown to a certain critical thickness when strained. For sufficiently high strains, the critical thickness can be only one monolayer or less, which sets a limit on the amount of strain that can be obtained from quantum well structures. In quantum wires, it is possible to reach higher degrees of strain and, in particular, it is possible to obtain negative hydrostatic pressure. Thus, a segmented wire 710 as shown in FIG. 9B comprises a portion 712 that is in tension can be provided. By selecting a suitable combination of materials, portion 712 may have a lattice constant smaller than adjacent portions 714, 716. For a 10-nm-diameter wire, for example, a relatively large amount of strain can be obtained. The lattice mismatch that can be accommodated is larger than that in a quantum well since tension portion 712 can assume a lattice constant closer to the lattice constant it would have in a bulk material of that composition.

Segmented nanowire 710 can further be "capped" with various capping materials 724 to arrive at a nanowire structure 720 having quantum dots embedded therein, as shown in FIG. 9C. As shown, segment 722 can be effectively a quantum dot surrounded by adjacent segments 726 and capping material 724 in the nanowire structure. The capping material 724 may be the same as, or different from, the material of adjacent segments 726. Using this design, quantum dot 722 can experience a negative hydrostatic pressure which is larger than that experienced by a quantum dot in non-capped nanowire 710, as shown in FIG. 9B. In comparison, quantum dots grown using the Stranski-Krastanow method are in compression, not tension, and do not experience a negative hydrostatic pressure.

The larger the bulk lattice constant of the semiconductor material used to form quantum dot 722, the higher the hydrostatic pressure of the quantum dot 722. At sufficiently high hydrostatic pressures, the quantum dots can be made to undergo a phase transition from a semiconducting phase to a metallic phase. By way of illustration, at a pressure of about 100 kbar in bulk materials, there can be a phase transition of III-V semiconductors from a semiconducting phase to a metallic phase. The exact pressure threshold depends on the particular semiconductor materials. The pressures that can be reached in nanowires, such as those shown in FIGS. 9B and 9C, can be of a similar magnitude or higher. Thus, structures can be designed to form a metallic inclusion in the nanowire, where the metallic portion can be originally a quantum dot that has gone through a phase transition. As noted above, the pressure can be increased by capping the nanowire, thereby forcing such a phase transition.

Structures similar to those shown in FIGS. 9B and 9C can be extended to include two or more quantum dots. In a two-dot system, the electronic states of the dots change when the distance between them varies. Thus, the quantum dots can be spaced along the nanowire such that they operate as isolated individual dots. Alternatively, the quantum dots can be close enough to form bonding and anti-bonding states through coupling. Such bonding and anti-bonding states may be observed through emission lines in PL spectroscopy using, for example, a Hanbury-Brown and Twiss interferometer. PL spectroscopy can be particularly suitable for the studies of quantum dots embedded in the wires because of the narrow line widths. Thus, photon statistics of quantum dots-in-wire systems can be engineered by adjusting the number, the distance between, and the pressure of the dots, thereby generating single photons on demand and double photons on demand.

The design of the present nanowire devices can be aided with theoretical modeling, particularly an eight-band k.p-theory-based model. Using such a model, a single-particle spectrum can be calculated in a realistic manner. For example, strain, piezoelectric polarization, electromagnetic fields as well as any external potentials may be included in the modeling. In addition, multi-particle states can be calculated. Examples of multi-particle states include excitons, which are bound states of electron-hole pairs, bi-excitons, tri-excitons, and charged bi-excitons, etc.

Band-edge diagrams of core-shell structures, optionally including embedded dots, can be calculated as a function of core radius for various III-V semiconductors. In addition, band-edge diagrams of segmented wires involving various III-V semiconductors as a function of segment thickness can also be calculated in aiding the designs.

The semiconductor heterostructure nanowire device designs can also be aided by pair density functional theory (EFT), which is a generalization of density functional theory (DFT). Pair density, $n(x,y)$, can be used as the basic variable. Pair density $n(x,y)$ provides the probability of finding one electron at position x and another at position y, and can be used to accurately calculate the Coulomb energy of a system, and the energy due to interactions with external potentials. Typically the kinetic energy functional can be approximated, for example, using the von Weisacker function.

Figure 10A:
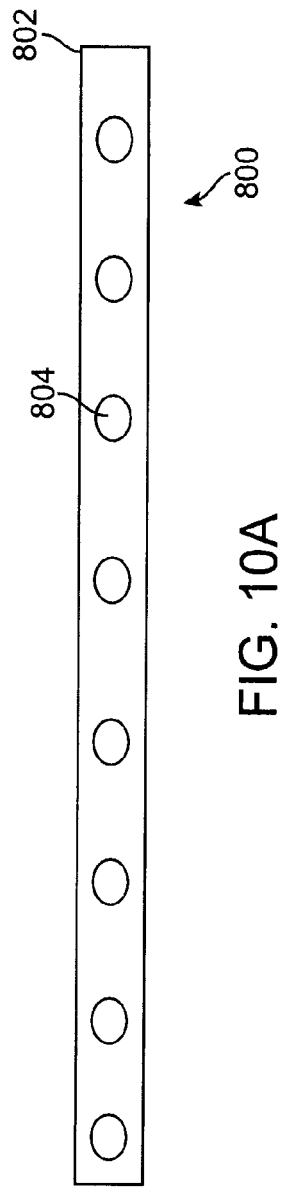
FIG. 10A is a schematic diagram of an exciton crystal in accordance with an embodiment.

Exciton Crystal Nanowires:

In another aspect, as shown in FIG. 10A, an exciton crystal 800 is provided having a plurality of excitons 804 lined up in a quantum wire 802. In such a case, the excitons line up as shown in FIG. 10A and have repulsive interactions therebetween. Such a property can be difficult to obtain in homogeneous wires, but can be realized in heterostructure wires in accordance with the embodiments disclosed herein.

The excitons can belong lived and thus provide sufficient time for exciton crystal 800 to form with a sufficiently high exciton density before excitons 804 recombine. Exciton crystal 800 forms because it can be very difficult for excitons 804 to pass each other in the one-dimensional system. Exciton crystal 800 is a new phase of matter, and may have a melting point as high as, for example, 50 K.

Figure 10B:
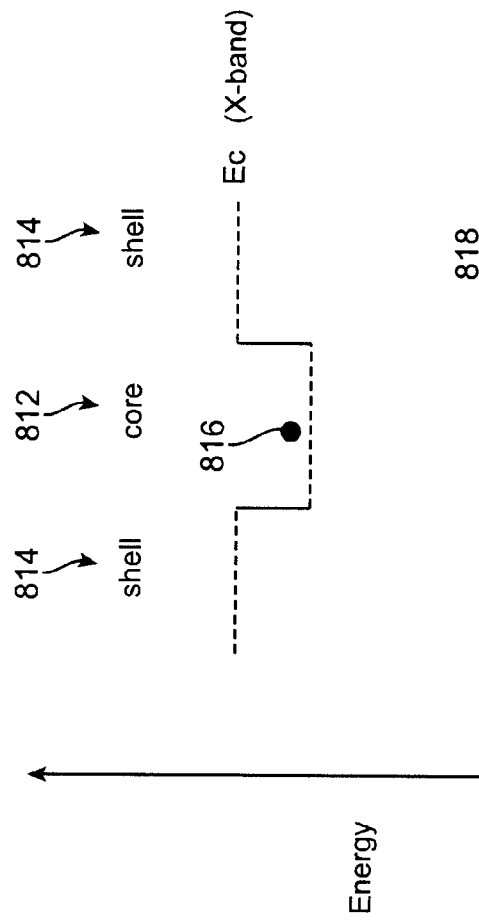
FIG. 10B is a diagram illustrating a band structure of the exciton crystal.

By way of illustration, a core-shell wire 810 having a band structure as shown in FIG. 10B can be used to realize exciton crystal 800 of FIG. 10A. Core portion 812 can comprise GaP, and shell portion 814 can comprise AlP. An inverse configuration with AlP in the core and GaP in the shell is also possible.

The AlP/GaP combination can be a lattice matched system so there can be little or no strain. As shown in the simplified band structure, electrons 816 will concentrate in core portion 812, and holes 818 concentrate in shell portion 814, thereby forming a type II structure. Furthermore, the band gap is indirect. These features will give rise to very long-lived excitons having a life time on the order of one millisecond. The separation of the charges will give the required repulsive interaction between excitons 804.

Experimental signatures of exciton crystal 800 include, for example, a change in the PL line-shape. When the exciton power density increases, a narrowing of the emission may occur. A more sensitive test can be a change in the photon statistics. Uncorrelated excitons will decay and emit photons which can be bunched (due to the bosonic nature of photons) to a certain degree. An exciton crystal likely will exhibit superradiance and emit many photons at once. This signature may be detected in a Hanbury-Brown Twiss interferometer. When performing pulsed PL, a difference in the PL lifetime between the exciton crystal and the state without crystallization can be expected.

What is claimed is:

1. A heterostructure semiconductor nanowire device, comprising:
a first portion comprising a first compound semiconductor material; and
a second portion adjacent to the first portion and comprising a second compound semiconductor material,
wherein the first compound semiconductor material and the second compound semiconductor material are selected such that at least one of the first portion or the second portion is substantially metallic.

2. The device of claim 1, wherein at least one of the first portion and the second portion is substantially metallic as the result of a strain-induced semiconductor-to-metallic phase transition.

3. The device of claim 1, wherein the first portion comprises a core portion, and wherein the second portion comprises a shell portion epitaxially grown on, and substantially surrounding, the core portion.

4. The device of claim 3, wherein the first compound semiconductor material and the second compound semiconductor material are selected such that a band structure in a transverse direction of the device has a type III configuration, wherein a bandgap of the core portion does not overlap with a bandgap of the shell portion, and wherein a Fermi level is located between the bandgap of the core portion and the bandgap of the shell portion.

5. The device of claim 4, wherein the first compound semiconductor material and the second compound semiconductor material are selected from GaSb, GaP, InP, InAs, GaAs, AlP, AlAs, AlSb, and InSb.

6. The device of claim 5, wherein a combination of the first compound semiconductor material and the second compound semiconductor material is selected from GaSb/InAs, InSb/GaP, InSb/GaAs, InSb/InP, and InSb/InAs.

7. The device of claim 3, wherein the first compound semiconductor material and the second compound semiconductor material are selected such that at least one of the core portion or the shell portion has a negative bandgap where a conduction band minimum is below a valence band maximum.

8. The device of claim 7, wherein the first compound semiconductor material and the second compound semiconductor material are selected from GaSb, GaP, InP, InAs, GaAs, AlP, AlAs, AlSb, and InSb.

9. The device of claim 8, wherein a combination of the first compound semiconductor material and the second compound semiconductor material is selected from AlP/InSb, GaP/InSb, AlAs/InSb, GaAs/InSb, and InAs/InSb.

10. The device of claim 1, comprising at least one second portion providing at least one second segment disposed between two first portions providing at least two first segments, such that the second segment is sandwiched between the first segments.

11. The device of claim 10, wherein the at least one second segment is in tension.

12. The device of claim 11, further comprising a shell structure comprising a capping material substantially surrounding the first and second segments, wherein the second segment forms a quantum dot under a negative hydrostatic pressure.

13. The device of claim 11, wherein the first segments are substantially metallic as a result of a strain-induced semiconductor-to-metallic phase transition.

14. A nanoelectronics system, comprising:
a heterostructure semiconductor nanowire device comprising:
a first portion comprising a first compound semiconductor material; and
a second portion adjacent to the first portion and comprising a second compound semiconductor material,
wherein the first and second compound semiconductor materials are selected such that at least one of the first portion or the second portion is substantially metallic and forms a contact of the device; and
an external circuit electrically coupled to the device through the contact.

15. The system of claim 14, wherein the first portion comprises a core portion, wherein the second portion comprises a shell portion epitaxially grown on, and substantially surrounding, the core portion, and wherein the contact comprises at least one of the core portion and the shell portion, the contact being substantially metallic as a result of a strain-inducted semiconductor-to-metallic phase transition.

16. The system of claim 14, further comprising at least one second portion providing at least one second segment disposed between two first portions providing at least two first segments, such that the at least one second segment is sandwiched between the first segments, wherein the contact comprises at least one of the first segments or the second segment, and wherein the contact is substantially metallic as a result of a strain-induced semiconductor-to-metallic phase transition.

* * * * *